United States Patent
Teng (10) Patent No.: US 9,384,844 B1
(45) Date of Patent: Jul. 5, 2016

(54) FLASH MEMORY APPARATUS AND DATA ERASING METHOD THEREOF

(71) Applicant: Powerchip Technology Corporation, Hsinchu (TW)

(72) Inventor: Tsai-Ko Teng, Hsinchu (TW)

(73) Assignee: Powerchip Technology Corporation, Hsinchu (TW)

( * ) Notice: Subject to any disclaimer, the term of this patent is extended or adjusted under 35 U.S.C. 154(b) by 0 days.

(21) Appl. No.: 14/848,359

(22) Filed: Sep. 9, 2015

(30) Foreign Application Priority Data

Jul. 3, 2015 (TW) .............................. 104121664 A (51) Int. Cl.
*G11C 11/34* (2006.01)
*G11C 16/04* (2006.01)
*G11C 16/14* (2006.01)
*G11C 16/26* (2006.01)
*G11C 16/34* (2006.01)

(52) U.S. Cl.
CPC ................ *G11C 16/14* (2013.01); *G11C 16/26* (2013.01); *G11C 16/3445* (2013.01); *G11C 16/3468* (2013.01)

(58) Field of Classification Search
CPC .... G11C 16/14; G11C 16/26; G11C 16/3445; G11C 16/3468
USPC .............. 365/185.29, 185.18, 185.19, 185.22
See application file for complete search history.

(56) References Cited

U.S. PATENT DOCUMENTS

| 6,515,909 | B1 | 2/2003 | Wooldridge | |
| 6,781,882 | B2* | 8/2004 | Shimizu | G11C 16/16 365/185.18 |
| 7,263,006 | B2* | 8/2007 | Aritome | G11C 16/344 365/185.22 |
| 8,130,551 | B2 | 3/2012 | Oowada et al. | |
| 8,422,312 | B2* | 4/2013 | Sarin | G11C 11/5635 365/185.17 |
| 2003/0076710 | A1* | 4/2003 | Sofer | G11C 16/14 365/185.22 |
| 2005/0265081 | A1* | 12/2005 | Tran | G11C 16/3468 365/185.29 |
| 2012/0069677 | A1* | 3/2012 | Lee | G11C 16/0483 365/185.22 |

* cited by examiner

*Primary Examiner* — Toan Le
(74) *Attorney, Agent, or Firm* — Jianq Chyun IP Office (57) ABSTRACT

A flash memory apparatus and data erasing method thereof. The data erasing method includes: setting a plurality of incremental erasing voltages sequentially, and operating a plurality of data erasing operations on memory cells according to the erasing voltages; recording a recoded erasing voltage corresponding to the last data erasing operation; setting a plurality of incremental reading voltage sequentially, operating a plurality of data reading operations on the memory cells, and recording a final reading voltage corresponding to the last reading operation; setting a final erasing voltage for operating a final erasing operation on the memory cells, wherein a voltage level of the final erasing voltage equals to a sum of voltage levels of an erasing verification voltage, the final reading voltage and the recorded erasing voltage.

18 Claims, 5 Drawing Sheets

FLASH MEMORY APPARATUS AND DATA ERASING METHOD THEREOF

CROSS-REFERENCE TO RELATED APPLICATION

This application claims the priority benefit of Taiwan application serial no. 104121664, filed on Jul. 3, 2015. The entirety of the above-mentioned patent application is hereby incorporated by reference herein and made a part of this specification.

BACKGROUND OF THE INVENTION

1. Field of the Invention

The present invention generally relates to flash memory apparatus, in particular, to a data erasing method for the flash memory apparatus.

2. Description of Related Art

As continuously developing in electronic technology, the electronic products have been the tools without missing in daily life. In order to provide sufficient information, the electronic product usually needs to implement with the storage medium, which is in higher speed and bigger storage capacity to store data. So, the non-volatile flash memory for accessing data has played an essential role.

Figure 1:
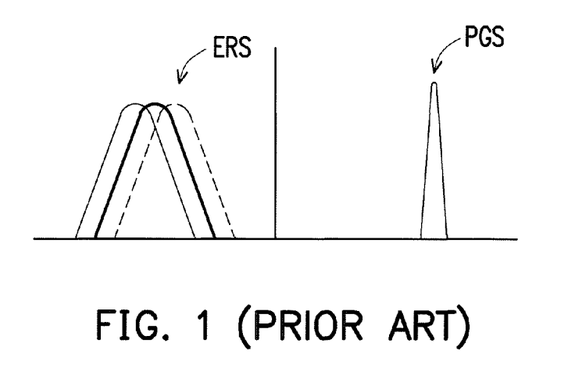
FIG. 1 is a drawing, schematically illustrating the threshold voltage distribution of the memory cells in the flash memory.

In the conventional technology, when a data erasing operation is intended to erase data of the memory cells of the flash memory, it needs to erase all data of the memory cells in the whole block. FIG. 1 is a drawing, schematically illustrating the threshold voltage distribution of the memory cells in the flash memory. As referring to FIG. 1, it includes the memory cells at the erased state ERS and the memory cells at the programmed state PGS. The data erasing operation by incremental stepping pulse erase (ISPE) is usually used in the conventional technology to erase memory cells. Further, this conventional data erasing operation uses voltage pulses with incremental voltages to perform multiple data erasing operations on the memory cells. However, the voltage pulses with large voltage level would cause the drift speed of the threshold voltage for a portion of memory cells to be too fast, resulting in out of control due to over-large range of the threshold voltage distribution of the erased memory cells.

SUMMARY OF THE INVENTION

The present invention is directed to flash memory apparatus and its data erasing method, so the range of the threshold voltage distribution for the memory cells at the erased state can be controllable.

A data erasing method for flash memory in the invention includes: setting a plurality of erasing voltages by incrementing level sequentially and respectively performing a plurality of data erasing operations on the memory cells of the flash memory according to the erasing voltages; performing a normal reading operation on the memory cells after each time of the data erasing operations, and determining whether or not a next data erasing operation is needed according reading results of the normal reading operation, and recording a last one of the erasing voltages of a last time of the data erasing operations as a recorded erasing voltage; setting a plurality of reading voltages with incremental value sequentially after an end of the data erasing operations, and performing a plurality of reading operations on the memory cells according to the reading voltages, wherein the reading results of the reading operations are used to determine whether or not a next reading operation is needed and recording a final reading voltage for a last time of the reading operations; setting a final erasing voltage to perform a final erasing operation on the memory cells, wherein a voltage level of the final erasing voltage is equal to a sum of a voltage level of an erasing verification voltage, a voltage level of the final reading voltage, and a voltage level of the recorded erasing voltage.

A flash memory apparatus in the invention includes a plurality of memory cells, a sensing circuit, and control unit. The memory cells form a memory cell array. The sensing circuit is coupled to the memory cell array. The control unit is coupled to the sensing circuit. The control unit is used to perform: setting a plurality of erasing voltages by incrementing level sequentially and respectively performing a plurality of data erasing operations on the memory cells according to the erasing voltages; performing a normal reading operation on the memory cells by the sensing circuit after each time of the data erasing operations, and determining whether or not a next data erasing operation is needed according reading results of the nonrmal reading operation, and recording a last one of the erasing voltages of a last time of the data erasing operations as a recorded erasing voltage; setting a plurality of reading voltages with incremental value sequentially after an end of the data erasing operations, and performing a plurality of reading operations on the memory cells by the sensing circuit according to the reading voltages, wherein the reading results of the reading operations are used to determine whether or not a next reading operation is needed and recording a final reading voltages for a last time of the reading operations; setting a final erasing voltage to perform a final erasing operation on the memory cells, wherein a voltage level of the final erasing voltage is equal to a sum of a voltage level of an erasing verification voltage, a voltage level of the final reading voltage, and a voltage level of the recorded erasing voltage.

As to foregoing description, the invention obtains the recorded erasing voltage by performing the data erasing operations with incremental stepping pulses in accordance with a normal reading operation, and obtains the final reading voltage of the threshold voltage distribution range of the memory cells by performing multiple reading operations. The invention further sets the final erasing voltage according to the recorded erasing voltage and the final reading voltage to perform the final erasing operation on the memory cells by the final erasing voltage. As a result, the properties of the memory cells after erasing can be effectively controlled.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 2:
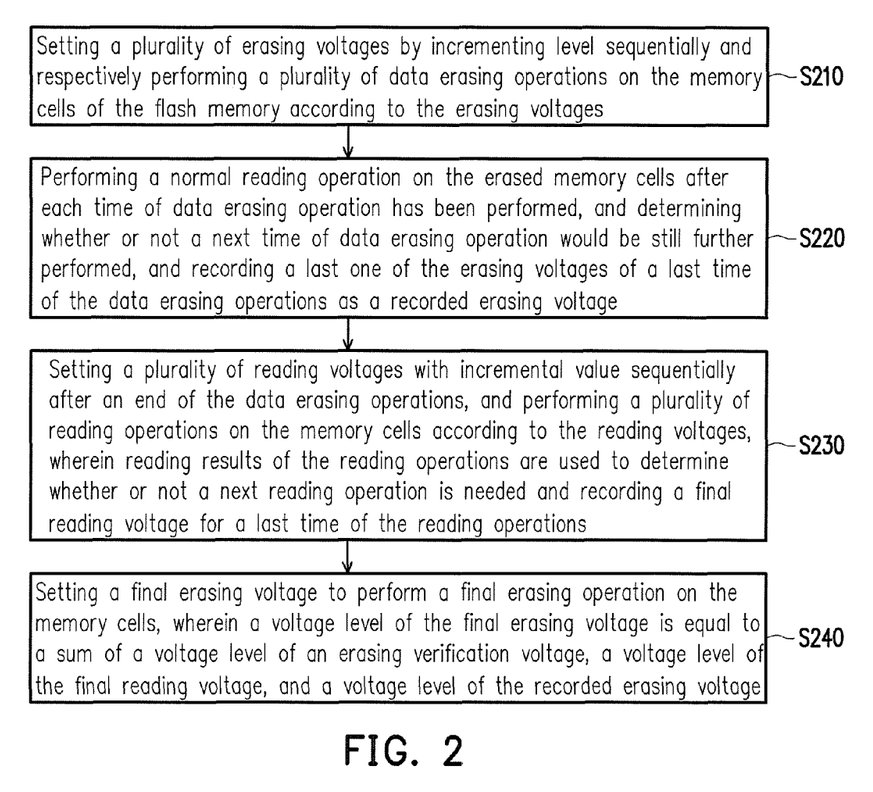
FIG. 2 is a drawing, schematically illustrating the flow chart of the data erasing method for the flash memory, according to an embodiment of the invention.

FIG. 2 is a drawing, schematically illustrating the flow chart of the data erasing method for the flash memory, according to an embodiment of the invention. Referring to FIG. 2, in the step S210, it sets a plurality of erasing voltages by incrementing level sequentially and respectively performs a plurality of data erasing operations on the memory cells of the flash memory according to the erasing voltages. In detail, when the first time of data erasing operation is to be performed, a voltage level of the erasing voltage (first erasing voltage) can be set to be equal to an initial erasing voltage and the first time of data erasing operation can be performed according to the first erasing voltage. Then, when the second time of data erasing operation is to be performed, the voltage level of the erasing voltage (second erasing voltage) is again set to be equal to the first erasing with addition of a predetermined increment voltage level, and the second time of data erasing operation is performed according to the second erasing voltage. By repeating the above data erasing operations, a plurality of data erasing operations can be performed on the memory cells.

In addition, after each time of data erasing operation in the step S210, the step S220 can perform a normal reading operation on the erased memory cells after each time of data erasing operation has been performed. The foregoing normal reading operation can judge the erased state for the memory cells. Further, by the normal reading operation in step S220, it can be judged whether or not all of the memory cells have been erased to a state that the threshold voltage is smaller than the reading voltage of the reading operation, so as to determine whether or not the data erasing operation in step S210 would be still further performed. For example, when the step S220 judges that all of the read results of the normal reading operations are equal to an expected value (e.g. equal to "FF" for 8 bit data), then a next time of data erasing operation in step S210 can stop. Comparatively, when the step S220 judges that not all of the read results of the normal reading operations are equal to the expected value, a next time of data erasing operation in step S210 would be still needed.

Further to mention, the number of the data erasing operations in step S210 can have an upper limit. In the embodiment of the invention, it can be determined that the data erasing operation should be forcibly stop by judging whether or not the times of performing data erasing operations are greater the predetermined upper limit of data erasing operation. When the times of performing data erasing operations are not greater than the predetermined upper limit of data erasing operation, the next data erasing operation keeps on. Further, the step S220 determines that the next data erasing operation is still in need, the next data erasing operation is then performed. Comparatively, when the times of performing data erasing operations are greater than the predetermined upper limit of data erasing operation, the next data erasing operation need to be stop. Then, the next data erasing operation stops and it judges that the data erasing operation on the flash memory is a failure.

When the step 220 determines that the data erasing operation in step S210 is not needed to keep on, then the step S230 can be performed. In step S230, a plurality of reading voltages with incremental value sequentially are set and a plurality of reading operations on the memory cells according to the reading voltages are performed. In detail, after the first time of reading operation, a voltage level of the first reading voltage can be set by a first voltage level, and the first reading voltage being set is used to perform reading operation on the memory cells. Next, the reading results of the reading operation on the memory cells by the first reading voltage are judged whether or not all are equal to an expected value (e.g. "FF" in 8 bit data). If the reading results of the reading operation on the memory cells by the first reading voltage are not all equal to the expected value, then a second reading voltage is set, wherein a voltage level of the second reading voltage is equal to the first reading voltage with addition of a predetermined incremental value of reading voltage, and the second reading voltage is used to performs reading operation the memory cells.

The foregoing reading operations can be repeated until all of the reading results of the reading operation on the memory cells are equal to the expected value, then the foregoing reading operation can stop. Further, the reading voltage for a last time of reading operation can be recorded as a final reading voltage. For example, if the reading results of the first time of reading operation are all equal to the expected value, the voltage level of the first reading voltage is the voltage level of the final reading voltage.

Next, in step S240, a final erasing voltage is set and a final erasing operation is performed on the memory cells according to the final erasing voltage. Wherein, in an embodiment, a voltage level of the final erasing voltage can be equal to a sum of a voltage level of an erasing verification voltage, a voltage level of the final reading voltage, and a voltage level of the recorded erasing voltage.

Remarkably, after the completion of step S240, an erasing verification operation can be performed on the memory cells. If an error occurs in the erasing verification operation, then the voltage level of the final erasing voltage is further added with a voltage level of an adjusting voltage, and the foregoing final erasing operation with the corresponding erasing verification operation is repeated until no error occurs in the erasing verification operation.

Figure 3:
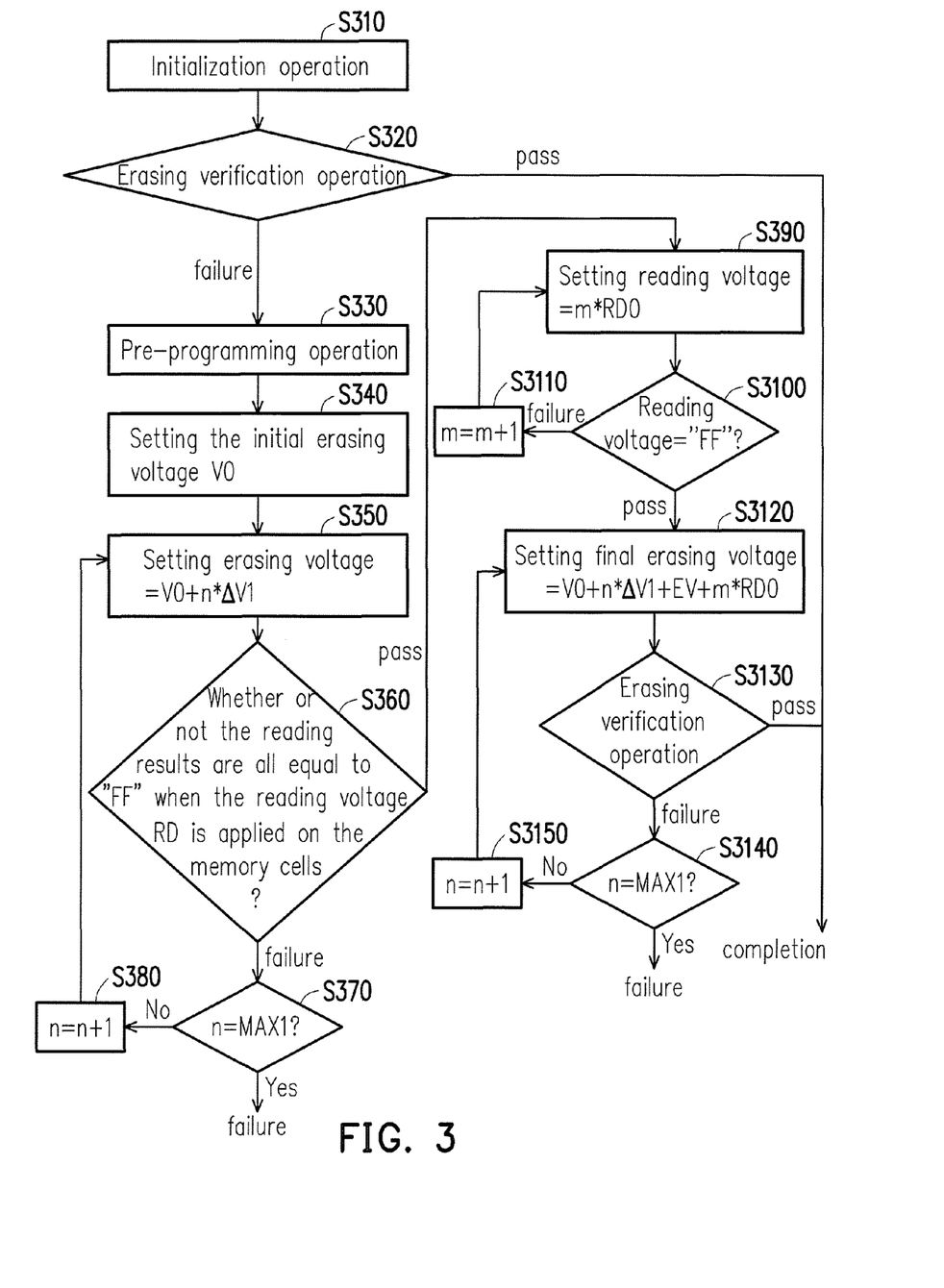
FIG. 3 is a drawing, schematically illustrating the flow chart of the data erasing method for the flash memory, according to another embodiment of the invention.

In order to describe the step flow of the data erasing method in the invention by further detail, FIG. 3 and FIGS. 4A-4F are referred. FIG. 3 is a drawing, schematically illustrating the flow chart of the data erasing method for the flash memory, according to another embodiment of the invention. FIGS. 4A-4F are drawings, schematically illustrating the changing states of the threshold voltage distribution of the memory cells, according to an embodiment of the invention. In step S310, an initialization operation is performed. In simple description, the variable parameters of n and m, which are to be used later, as 0. In step S320, an erasing verification operation is performed on the memory cells. If the verification results have all passed, it indicates that all of the memory cells are at the erased state, and there is no need about further erasing operation. Comparatively, if the verification result in step S320 is a failure, then the step S330 or the step S340 with jumping over the step S330 is performed.

Figure 4A:
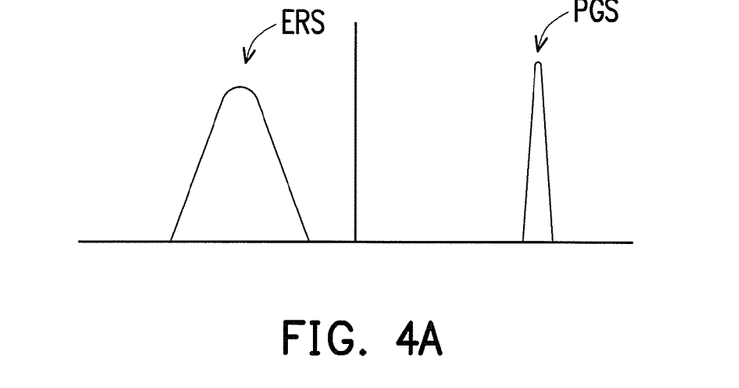
FIGS. 4A-4F are drawings, schematically illustrating the changing states of the threshold voltage distribution of the memory cells, according to an embodiment of the invention.
Figure 4B:
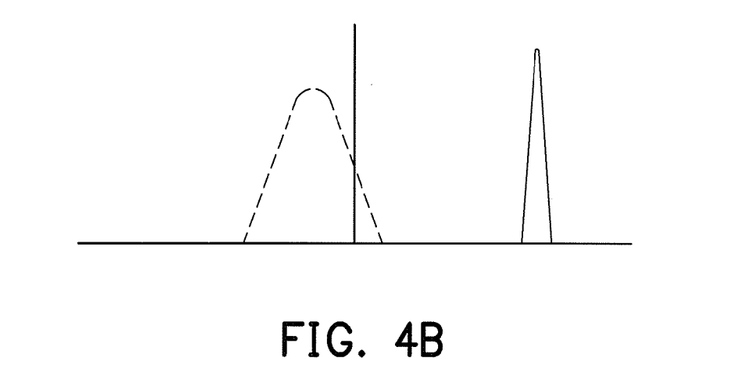

In step S330, a pre-programming operation is performed on the memory cells, as referring to FIG. 4A and FIG. 4B. In FIG. 4A, before performing the step S330, a portion of the memory cells are distributed in the region with erased state ERS. Another portion of the memory cells are distributed in the region with programmed state PGS. After performing the step S330, the threshold voltage distribution of the memory cells at the erased state ERS is shifting toward the region of programmed state PGS. The distribution of the memory cells at the region of the programmed state PGS is substantially not changed.

Referring to FIG. 3 again, the step S340 is then performed to set the initial erasing voltage V0. In addition, in step S350, the erasing voltage is set as the initial erasing voltage V0 with addition of n times of predetermined incremental value $\Delta$V1, and the data erasing operation on the memory cells is performed, according to the erasing voltage being set. The variable parameter n in the first time to perform the step S350 is equal to 0.

When completion of perform the first time of data erasing operation, the reading operation in step S360 can be performed on the memory cells at the reading voltage RD. If the reading results are all equal to expected value (e.g. "FF" for 8 bit data), the step S390 is performed and the operation of the step S350 stop, no longer being performed again. On the other hand, if the reading results are not all equal to "FF", the step S370 is performed. In step S370, the variable parameter n is judged whether or not equal to an upper limit MAX1 for the times of performing the erasing operation. If the variable parameter n is less than the upper limit MAX1 for the times of performing the erasing operation, then the variable parameter n in step S380 is added with 1 and the voltage level of the erasing voltage is raised by the step S350. As a result, the steps S350-S380 form a loop, the voltage level of the erasing voltage can be gradually raised and the data erasing operations on the memory cells can be sequentially performed until the judged result in the step S360 is "yes".

Figure 4C:
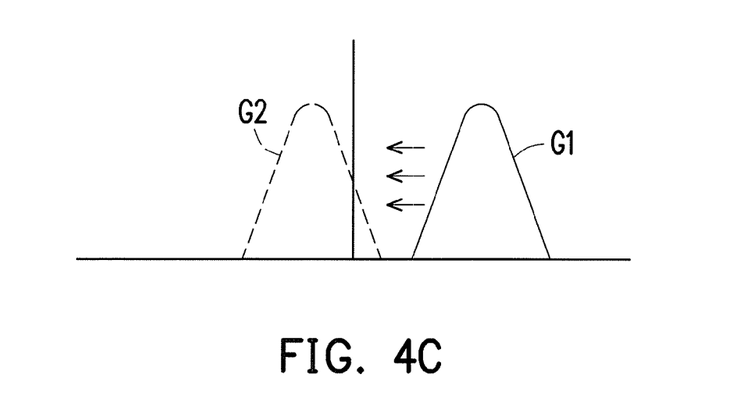

In accordant with the steps S350-S380, referring to FIG. 4C, the threshold voltage distribution for the memory cells G1 originally staying at the programmed state PGS is shifting in a direction toward left because of one time and multiple time of data erasing operation in steps S350-S380. The threshold voltage distribution of the memory cells G2 originally staying at the erased state ERS has no significant change. Remarkably, because a change of the threshold voltage for each memory cell of the memory cells G1 is not consisting, a density of the threshold voltage distribution of the memory cells G1 is accordingly reduced by the data erasing operation in steps S350-S380. In addition, after the completion of the data erasing operation of the steps S350-S380, a last one of the variable parameter n is recorded.

Figure 4D:
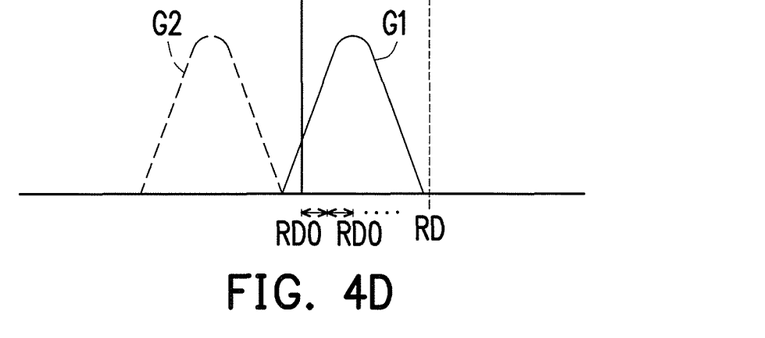
Figure 4E:
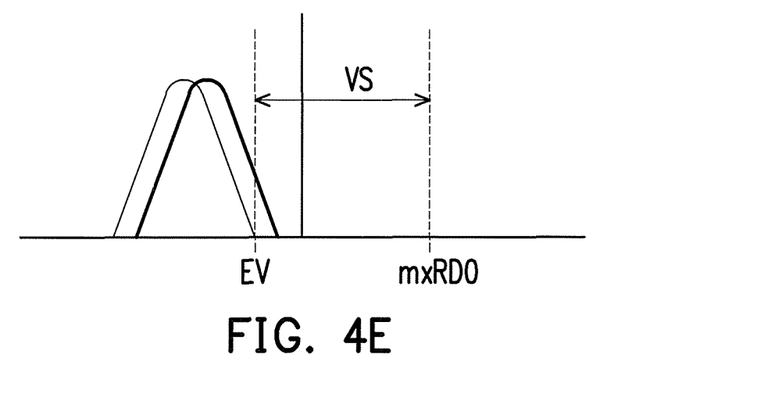

Also referring to FIG. 4D, when the judging result from the step S360 is "yes", the distribution states for the memory cells G1 and G2 can be the states as shown in FIG. 4D.

Referring to FIG. 3 again, the step S390 is the action to set the reading voltage, so the reading voltage is equal to a value of the predetermined incremental value of reading voltage RD0 timed by the variable parameter m. Next, the reading operation is performed on the memory cells in step S3100 according to the reading voltage being set, and it is judged whether or not all of the reading results are equal to "FF". When the judging result in step S3100 is "no", the variable parameter m is added by 1 in step S3110 and the step S310 is performed again by increasing the voltage level of the reading voltage by one value of the predetermined incremental value of reading voltage RD0. The step S3100 is performed again, then.

Also referring to FIG. 4D, wherein, a loop is formed from the steps S390-S3110. By gradually increasing the reading voltage according to the predetermined incremental value of reading voltage RD0, the voltage level of the upper border (maximum) of the threshold voltage distribution of the memory cells can be found. The voltage level of the upper border (maximum) of the threshold voltage distribution of the memory cells is a final reading voltage m×RD0 when the judging result in step S3110 is "yes". The final quantity of the variable parameter m would be recorded.

Also referring to FIG. 3, when the judging result in step S3100 is "yes", the step S3120 can set the final erasing voltage, wherein the final erasing voltage=V0+n×$\Delta$V1+EV+m×RD0, where EV is a target voltage level of the upper border of the threshold voltage distribution of the memory cells after being erased. Next, the final data erasing operation is performed on the memory cells according to the final erasing voltage. With respect to FIG. 4E, after the final erasing operation in step S3120 is performed, the threshold voltage distribution of all of the memory cells is generally shifting toward to left in drawing by a voltage shift VS, in which VS=EV+m×RD0+ constant. The coefficient for the erasing voltage of memory cell can be 1, and the value of the constant can be 0.

Figure 4F:
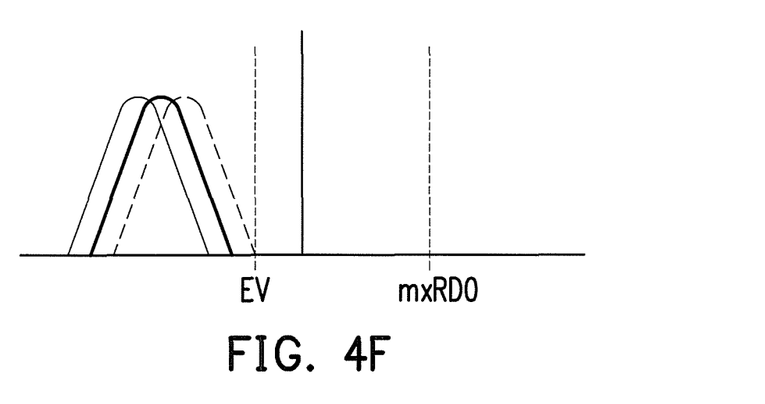

Since the foregoing final data erasing operation does not guarantee that all of the memory cells are stably erased, the step S3130 is still in need to perform the erasing verification operation. If the erasing verification operation has passed, it indicates that the erasing operation on the memory cells has accomplished. If the erasing verification operation is failure and the value of the variable parameter n is still less than the upper limit MAX1 for the times of performing the erasing operation, the variable parameter n can be incrementally increased by the step S315. The voltage level of the final erasing voltage can be adjusted by the step of S3120 and the final data erasing operation can be performed one more time. As a result, the threshold voltage distribution of the memory cells as shown in FIG. 4F would be adjusted a little toward the left side in drawing until the erasing verification operation in step S3130 has passed and the data erasing operation has accomplished.

Additionally to mention, in step S3140, if the variable n increases to be not smaller than the upper limit MAX1 for the times of performing the erasing operation, it indicates that the memory cells cannot be further performed by the erasing operation and the data erasing operation is a failure.

Figure 5:
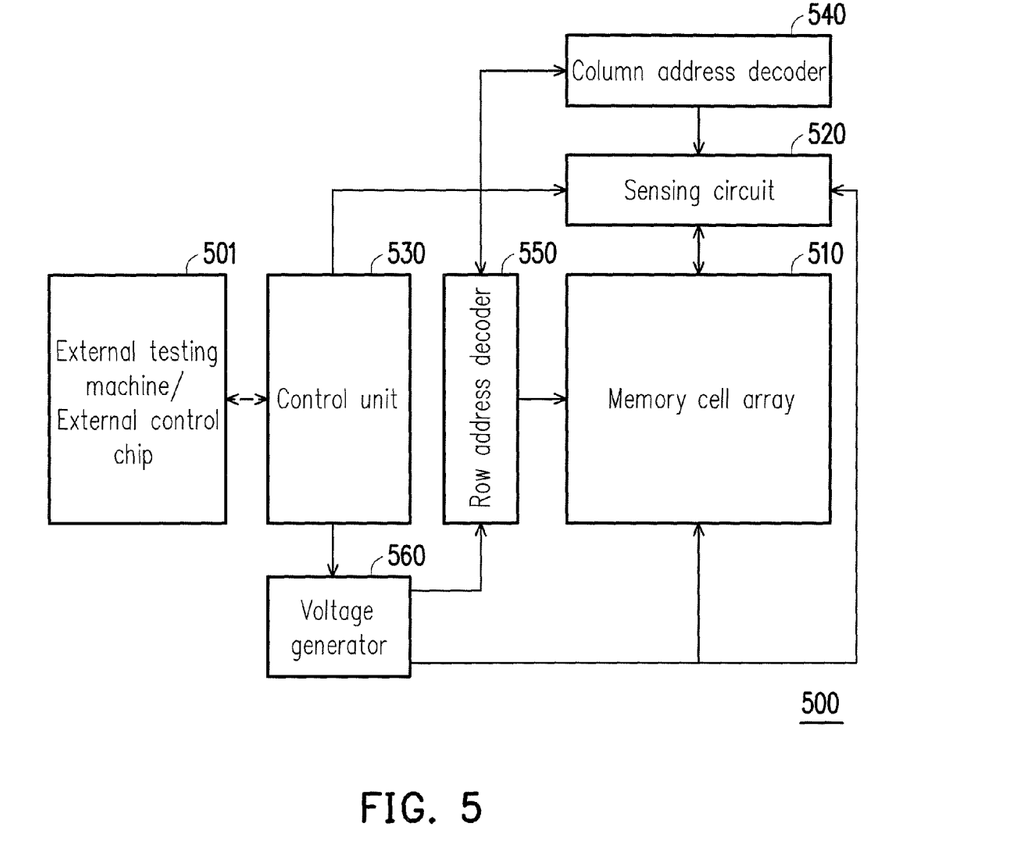
FIG. 5 is a drawing, schematically illustrating a block diagram of flash memory apparatus, according to an embodiment of the invention.

FIG. 5 is a drawing, schematically illustrating a block diagram of flash memory apparatus, according to an embodiment of the invention. Referring to FIG. 5, the flash memory apparatus 500 includes a memory cell array 510, a sensing circuit 520, a control unit 530, a column address decoder 540, a row address decoder 550 and voltage generator 560. The memory cell array 510 includes a plurality of memory cells. The control unit 530 is coupled to the voltage generator 560, the row address decoder 550, the column address decoder 540 and the sensing circuit 520. The voltage generator 560 is coupled to the memory cell array 510, the row address decoder 550, the column address decoder 540 and the sensing circuit 520. The sensing circuit 520 is coupled to memory cell array 510 and the column address decoder 540.

In the operations, the control unit 530 is used to perform all the steps of the embodiment shown in FIG. 2. The control unit 530 is setting a plurality of erasing voltages by incrementing level sequentially and respectively performing a plurality of data erasing operations on the memory cells according to the erasing voltages; performing a normal reading operation on the memory cells by the sensing circuit after each time of the data erasing operations, and determining whether or not a next data erasing operation is needed according a reading result of the normal reading operation, and recording a last one of the erasing voltages of a last time of the data erasing operations as a recorded erasing voltage; setting a plurality of reading voltages with incremental value sequentially after an end of the data erasing operations, and performing a plurality of reading operations on the memory cells by the sensing circuit 520 according to the reading voltages, wherein reading results of the reading operations obtained by the sensing circuit 520 are used to determine whether or not a next reading operation is needed and recording a final reading voltages for a last time of the reading operations; setting a final erasing voltage to perform a final erasing operation on the memory cells, wherein a voltage level of the final erasing voltage is equal to a sum of a voltage level of an erasing verification voltage, a voltage level of the final reading voltage, and a voltage level of the recorded erasing voltage.

Additionally to mention, the control unit 530 is further coupled to an external testing machine or external control chip 501. The control unit 530 records the recorded values including the predetermined initial erasing voltage, the predetermined incremental value of erasing voltage, the voltage level of the erasing verification voltage, the final reading voltage, the final erasing voltage, the number of the data erasing operations and the normal-reading number of performing the normal reading operations, and the recorded values are stored in the external testing machine or external control chip 501.

The generating operation for each of the various voltages in the foregoing operations can be done by the voltage generator 560. The other operations in the previous embodiments of the invention in detail have been described clearly, no further description is provided.

As to the foregoing descriptions, the invention obtains the recorded erasing voltage by performing the data erasing operations with incremental stepping pulses in accordance with a normal reading operation, and obtains the final reading voltage of the threshold voltage distribution range of the memory cells by performing multiple reading operations. As a result, the range of the threshold voltage distribution of the memory cells after erasing can be effectively controlled. The performance of the flash memory can be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data erasing method for flash memory, comprising:
    setting a plurality of erasing voltages increased by an incrementing level sequentially and respectively performing a plurality of data erasing operations on the memory cells of a flash memory according to the erasing voltages;
    performing a normal reading operation on the memory cells after each time of the data erasing operations, and determining whether or not a next data erasing operation is needed according reading results of the normal reading operation, and recording a last one of the erasing voltages of a last time of the data erasing operations as a recorded erasing voltage;
    setting a plurality of reading voltages increasing with an incremental value sequentially after an end of the data erasing operations, and performing a plurality of reading operations on the memory cells according to the reading voltages, wherein reading results of the reading operations are used to determine whether or not a next reading operation is needed and recording a final reading voltage level for a last time of the reading operations; and
    setting a final erasing voltage to perform a final erasing operation on the memory cells, wherein a voltage level of the final erasing voltage is equal to a sum of a voltage level of an erasing verification voltage, a voltage level of the final reading voltage, and a voltage level of the recorded erasing voltage.

2. The data erasing method for flash memory as recited in claim 1, wherein the step of setting the erasing voltages increased by the incrementing level sequentially and respectively performing the data erasing operations on the memory cells of the flash memory according to the erasing voltages comprise:
    setting a voltage level of a first erasing voltage to be equal to a voltage level of an initial erasing voltage and performing a first data erasing operation on the memory cells according to the first erasing voltage; and
    setting a voltage level of a second erasing voltage to be equal to the voltage level of the first erasing voltage with addition of a predetermined increment voltage level, and performing a second data erasing operation on the memory cells according to the second erasing voltage.

3. The data erasing method for flash memory as recited in claim 1, wherein the step of performing the normal reading operation on the memory cells after each time of the data erasing operations, and determining whether or not the next data erasing operation is needed according the reading results of the normal reading operation comprises:
    applying a predetermined voltage level for normal reading on a gate of memory cell, judging whether or not all of the reading results under the normal reading operation are equal to an expected value, when the reading results are all equal to the expected value, stopping performing the next data erasing operation, when the reading results are not all equal to the expected value, keeping on performing the next data erasing operation.

4. The data erasing method for flash memory as recited in claim 3, after the step when the reading results are not all equal to the expected value, further comprising:
    judging whether or not a number of the erasing operations having been performed is greater than an upper limit;
    keeping on performing the next data erasing operation when the number of the erasing operations having been performed is not greater than the upper limit; and
    stopping performing the next data erasing operation when the number of the erasing operations having been performed is greater than the upper limit.

5. The data erasing method for flash memory as recited in claim 1, wherein, after an end of the data erasing operations, steps to record the final reading voltage comprise:
    setting a voltage level of a first reading voltage as a first voltage level, which is used to perform a first reading operation on the memory cells;
    judging reading results of the first reading operation on the memory cells according to the first reading voltage;
    setting a voltage level of a second reading voltage to be equal to the voltage level of the first reading voltage with addition of a predetermined increment reading voltage value when the reading results of the first reading operation on the memory cells according to the first reading voltage are not all equal to the expected value, and performing a second reading operation on the memory cells according to the second reading voltage; and
    treating the first reading operation as a last reading operation when the reading results of the first reading operation on the memory cells according to the first reading voltage are all equal to the expected value, and recording the voltage level of the first reading voltage as the final reading voltage level.

6. The data erasing method for flash memory as recited in claim 1, wherein after the step of setting the final erasing voltage to perform the final erasing operation on the memory cells further comprising:

performing an erasing verification operation on the memory cells according to the erasing verification voltage;

adding a predetermined increment voltage value to the voltage level of the final erasing voltage when an erasing verification result of the erasing verification operation indicates an incorrect result and repeating the final erasing operation; and stopping the data erasing operations on the memory cells when the erasing verification result of the erasing verification operation indicates a correct result.

7. The data erasing method for flash memory as recited in claim 6, wherein when the erasing verification result of the erasing verification operation indicates the incorrect result, the method further comprises:

judging the number of the final erasing operations having been performed;

adding a voltage level of an adjusting voltage to the voltage level of the final erasing voltage when the number of the final erasing operation is less than a predetermined maximum threshold, and repeating the final erasing operation; and stopping the final erasing operation when the number of the final erasing operation is not less than the predetermined maximum threshold.

8. The data erasing method for flash memory as recited in claim 1, before the step of setting the erasing voltages increased by the incrementing level sequentially and respectively performing the data erasing operations on the memory cells of the flash memory according to the erasing voltages, further comprising:

performing a pre-programming operation on the memory cells.

9. The data erasing method for flash memory as recited in claim 1, further comprising:

recording a plurality of recorded values including a predetermined initial erasing voltage, a predetermined incremental value of erasing voltage, the voltage level of the erasing verification voltage, the final reading voltage level, the final erasing voltage, the number of the data erasing operations and the normal-reading number of performing the normal reading operations, wherein the recorded values are stored in an external testing machine or an external control chip.

10. A flash memory apparatus, comprising:

a plurality of memory cells to form a memory cell array;

a sensing circuit, coupled to the memory cells; and a control unit, coupled to the sensing circuit, wherein the control unit is used to perform:

setting a plurality of erasing voltages by incrementing level sequentially and respectively performing a plurality of data erasing operations on the memory cells according to the erasing voltages;

performing a normal reading operation on the memory cells by the sensing circuit after each time of the data erasing operations, and determining whether or not a next data erasing operation is needed according reading results of the normal reading operation, and recording a last one of the erasing voltages of a last time of the data erasing operations as a recorded erasing voltage;

setting a plurality of reading voltages with incremental value sequentially after an end of the data erasing operations, and performing a plurality of reading operations on the memory cells by the sensing circuit according to the reading voltages, wherein the reading results of the reading operations are used to determine whether or not a next reading operation is needed and recording a final reading voltages for a last time of the reading operations; and setting a final erasing voltage to perform a final erasing operation on the memory cells, wherein a voltage level of the final erasing voltage is equal to a sum of a voltage level of an erasing verification voltage, a voltage level of the final reading voltage, and a voltage level of the recorded erasing voltage.

11. The flash memory apparatus of claim 10, wherein the control unit is setting a voltage level of a first erasing voltage to be equal to a voltage level of an initial erasing voltage and performing a first data erasing operation on the memory cells according to the first erasing voltage; and setting a voltage level of a second erasing voltage to be equal to the voltage level of the first erasing voltage with addition of a predetermined increment voltage level, and performing a second data erasing operation on the memory cells according to the second erasing voltage.

12. The flash memory apparatus of claim 10, wherein the control unit judge whether or not all of the reading results provided from the sensing circuit for the normal reading operation are equal to an expected value; when the reading results are all equal to the expected value, stopping performing the next data erasing operation; when the reading results are not all equal to the expected value, keeping on performing the next data erasing operation.

13. The flash memory apparatus of claim 12, wherein when the reading results of the normal reading operation are not all equal to the expected value, the control unit performs: judging whether or not a number of the erasing operations having been performed is greater than an upper limit; keeping on performing the next data erasing operation when the number of the erasing operations having been performed is not greater than the upper limit; stopping performing the next data erasing operation when the number of the erasing operations having been performed is greater than the upper limit.

14. The flash memory apparatus of claim 10, wherein the control unit sets a voltage level of a first reading voltage as a first voltage level and performs a first reading operation on the memory cells via the sensing circuit according to the first reading voltage; judging whether or not reading results of the first reading operation on the memory cells according to the first reading voltage are all equal to an expected result, the control unit sets a voltage level of a second reading voltage to be equal to the voltage level of the first reading voltage with addition of a predetermined increment reading voltage value when the reading results of the first reading operation on the memory cells according to the first reading voltage are not all equal to the expected value, and performs a second reading operation on the memory cells according to the second reading voltage; the control units treats the first reading operation as a last reading operation when the reading results of the first reading operation on the memory cells according to the first reading voltage are all equal to the expected value, and the voltage level of the first reading voltage is the final reading voltage level.

15. The flash memory apparatus of claim 10, wherein the control unit performs an erasing verification operation on the memory cells according to the erasing verification voltage; a predetermined increment voltage value is added to the voltage level of the final erasing voltage when an erasing verification result of the erasing verification operation indicates an incorrect result and the final erasing operation is repeated, wherein the data erasing operations on the memory cells accomplish when the erasing verification result of the erasing verification operation indicates a correct result.

16. The flash memory apparatus of claim 15, wherein the control unit judges the number of the final erasing operations having been performed and a voltage level of an adjusting voltage is added to the voltage level of the final erasing voltage when the number of the final erasing operation is less than a predetermined maximum threshold, and repeating the final erasing operation; the final erasing operation stops when the number of the final erasing operation is not less than the predetermined maximum threshold.

17. The flash memory apparatus of claim 10, wherein before the control unit performs the data erasing operations on the memory cells of the flash memory according to the erasing voltages, the control unit further performs a pre-programming operation on the memory cells.

18. The flash memory apparatus of claim 10, wherein the control unit is also coupled to an external testing machine or an external control chip, the control unit records a plurality of recorded values including a predetermined initial erasing voltage, a predetermined incremental value of erasing voltage, the voltage level of the erasing verification voltage, the final reading voltage level, the final erasing voltage, the number of the data erasing operations and the normal-reading number of performing the normal reading operations, wherein the recorded values are stored in the external testing machine or the external control chip.

* * * * *